(12) United States Patent
Honda

(10) Patent No.: US 12,249,374 B2
(45) Date of Patent: Mar. 11, 2025

(54) SEMICONDUCTOR DEVICE

(71) Applicant: MICRON TECHNOLOGY, INC., Boise, ID (US)

(72) Inventor: Harutaka Honda, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 255 days.

(21) Appl. No.: 17/817,140

(22) Filed: Aug. 3, 2022

(65) Prior Publication Data

US 2024/0046987 A1  Feb. 8, 2024

(51) Int. Cl.
| | | |
|---|---|---|
| *G11C 14/00* | (2006.01) | |
| *G11C 8/14* | (2006.01) | |
| *H01L 27/02* | (2006.01) | |
| *H10B 12/00* | (2023.01) | |

(52) U.S. Cl.
CPC ............ *G11C 14/0018* (2013.01); *G11C 8/14* (2013.01); *H01L 27/0207* (2013.01); *H10B 12/50* (2023.02)

(58) Field of Classification Search
CPC ...... G11C 14/0018; G11C 8/14; H10B 12/50; H01L 27/0207

USPC .................................................... 365/185.08
See application file for complete search history.

(56) References Cited

U.S. PATENT DOCUMENTS

| | | | |
|---|---|---|---|
| 6,421,295 B1* | 7/2002 | Mao .................. | G11C 11/4085 |
| | | | 365/189.11 |
| 2001/0026483 A1* | 10/2001 | Hasegawa ............ | G11C 29/72 |
| | | | 365/200 |
| 2019/0148389 A1* | 5/2019 | Lin ....................... | H10B 41/43 |
| | | | 257/508 |
| 2023/0230922 A1* | 7/2023 | Matsumoto ......... | H01L 23/5286 |
| | | | 257/773 |

FOREIGN PATENT DOCUMENTS

JP     2014029903 A   *  2/2014

* cited by examiner

*Primary Examiner* — Huan Hoang
*Assistant Examiner* — Daniel J King
(74) *Attorney, Agent, or Firm* — Dorsey & Whitney LLP

(57) ABSTRACT

An apparatus includes: a first memory mat; a second memory mat adjacent to the first memory mat; a peripheral circuit between the first memory mat and the second memory mat, the peripheral circuit defining a first boundary to the first memory mat and a second boundary to the second memory mat and including a plurality of wiring patterns in a wiring layer; and at least one dummy pattern in the wiring layer arranged on or along the first boundary.

20 Claims, 8 Drawing Sheets

SEMICONDUCTOR DEVICE

BACKGROUND

Recently, in semiconductor devices such as dynamic random-access memory (DRAM), the vertical dimensions of storage capacitors have been becoming larger relative to the horizontal dimensions, and the misalignment margin with respect to the plate electrodes of contacts connected to the wirings of peripheral circuits has been decreasing.

BRIEF DESCRIPTION OF THE DRAWINGS

FIG. 5 is a longitudinal section illustrating the schematic configuration of a portion along the line B-B in FIG. 3 and the line C-C in FIG. 4.

FIG. 6 is a plan view illustrating a schematic configuration of a memory mat and peripheral circuits. FIG. 7 is a longitudinal section illustrating a schematic configuration of a portion along the line D-D in FIG. 6.

DETAILED DESCRIPTION

Figure 1:
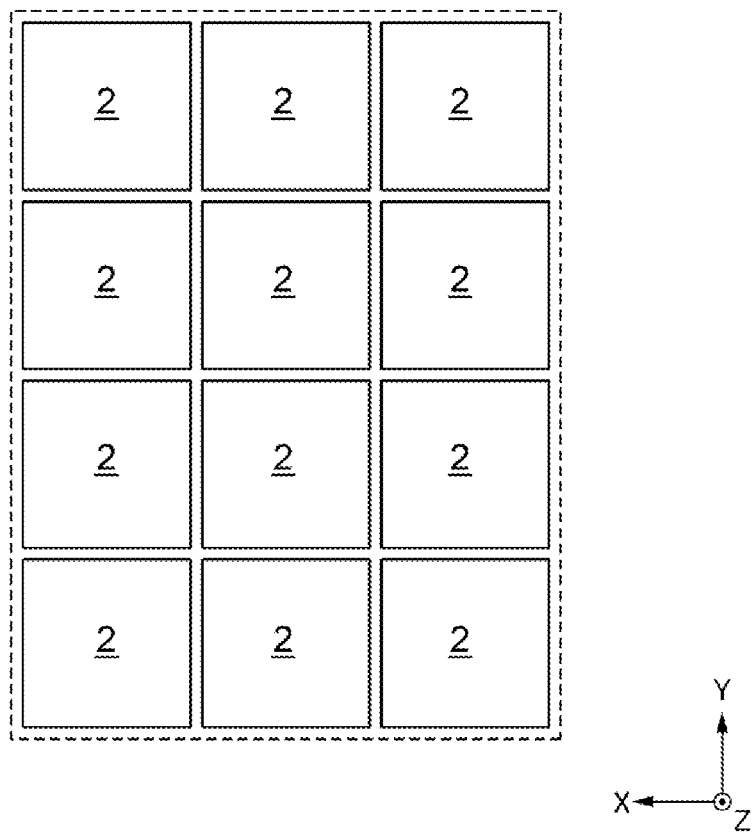
FIG. 1 is a plan view illustrating a schematic configuration of a portion of a semiconductor device according to an embodiment.

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Hereinafter, a semiconductor device according to the embodiments will be described with reference to the drawings. In the following description, dynamic random-access memory (hereinafter referred to as DRAM) is given as an example of the semiconductor device. In the description of the embodiment, common or related elements and elements that are substantially the same are denoted with the same signs, and the description thereof will be reduced or omitted. In the drawings referenced hereinafter, the dimensions and dimensional ratios of each unit in each of the drawings do not necessarily match the actual dimensions and dimensional rations in the embodiment. Furthermore, in the following description, the Y direction is perpendicular to the X direction. Also, the Z direction is the direction perpendicular to the X-Y plane defined as the plane of a semiconductor substrate, and is also referred to as the vertical direction.

Figure 2:
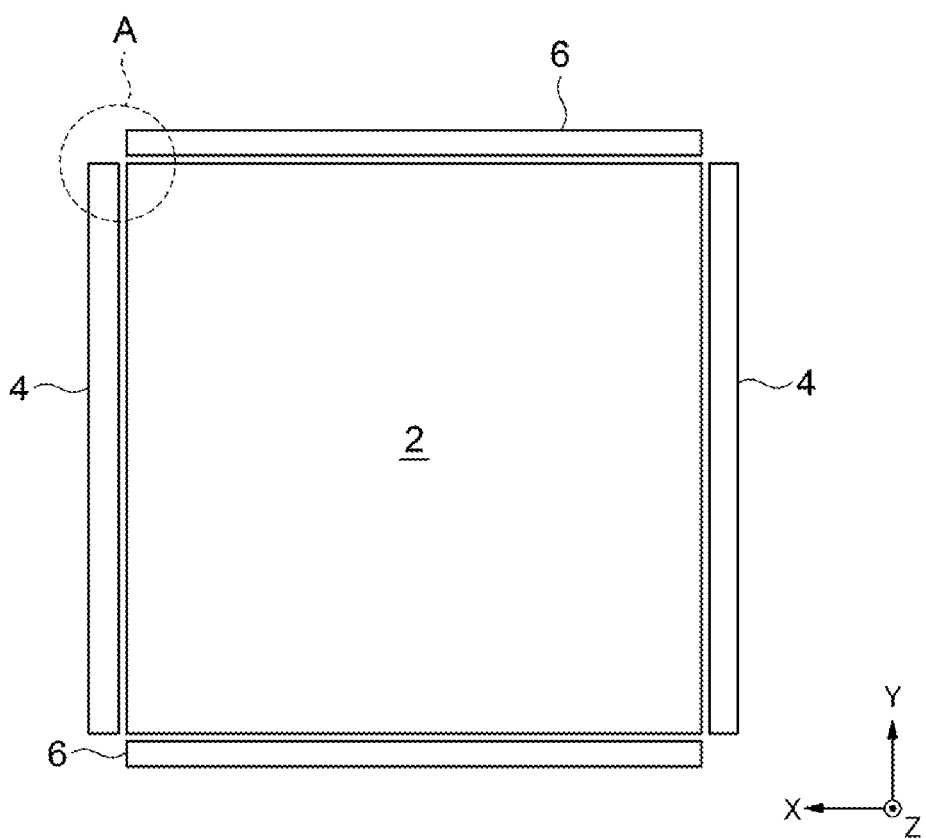
FIG. 2 is a plan view illustrating a schematic configuration of a memory mat and peripheral circuits according to a first embodiment.

FIGS. 1 and 2 are diagrams illustrating plan-view layouts of the semiconductor device according to the embodiment. As illustrated in FIG. 1, the semiconductor device is provided with a plurality of memory mats 2 disposed in a matrix on the surface of a semiconductor substrate. As illustrated in FIG. 1, each memory mat 2 has a substantially square shape. As illustrated in FIG. 2, a first peripheral circuit 4 is disposed along the edges of the memory mat 2 in the X direction. The first peripheral circuit 4 is provided with a sub-word driver, for example. As described later, the sub-word driver is connected to the word-lines of a plurality of memory cells arranged in the memory mat 2. The first peripheral circuit 4 is disposed between adjacent memory mats 2. A second peripheral circuit 6 is disposed along the edges of the memory mat 2 in the Y direction. The second peripheral circuit 6 is provided with a sense amplifier, for example.

Figure 8:
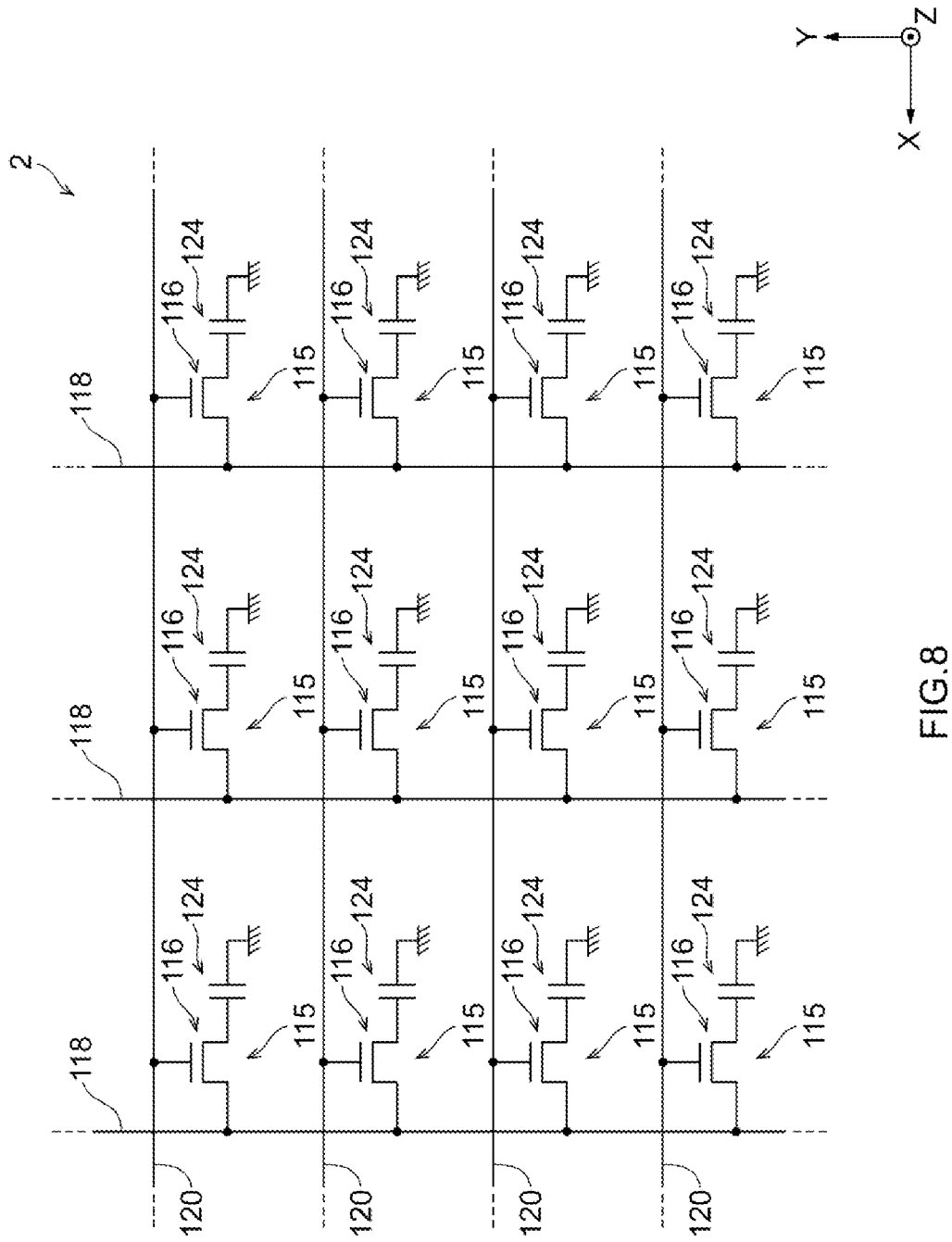
FIG. 8 illustrates an equivalent circuit of memory cells in a semiconductor device according to an embodiment.

FIG. 8 illustrates an equivalent circuit of a memory cell array of the semiconductor device according to the embodiments. A plurality of memory cells 115 are arranged in a matrix, with each memory cell 115 being connected to an intersection point between a plurality of word-lines 120 and a plurality of bit-lines 118 disposed orthogonally. A single memory cell 115 includes a pair of an access transistor 116 and a storage capacitor 124.

The access transistor 116 is provided with a metal-oxide-semiconductor field-effect transistor (MOSFET), for example. The gate electrode of the access transistor 116 functions as a DRAM word-line 120. The word-line 120 functions as a control line that controls the selection of the corresponding memory cell. Note that the storage capacitor 124 here corresponds to a storage capacitor 30 described later.

In each of the memory mats 2, a plurality of word-lines 120 are disposed in parallel, extending in the X direction of the diagram. In the memory mats 2, a plurality of bit-lines 118 are disposed in parallel, extending in the Y direction of the diagram.

One of the source and the drain of the access transistor 116 is connected to a bit-line 118, while the other is connected to the storage capacitor 124. The storage capacitor 124 includes a capacitor and stores data by holding accumulated charge in the capacitor.

Each of the word-lines 120 is connected to the first peripheral circuit 4 at the periphery of the memory mat 2. The bit-lines 118 are connected to the second peripheral circuit 6 at the periphery of the memory mat 2.

When writing data to one of the memory cells 115, a potential that turns on the access transistor 116 is applied to the word-line 120, while a low potential or a high potential corresponding to "0" or "1" of the data to be written is applied to the bit-line 118. When reading out data from one of the memory cells 115, a potential that turns on the access transistor 116 is applied to the word-line 120. With this arrangement, a data determination is made by having a sense amplifier, namely the second peripheral circuit 6 connected to the bit-line 118, sense the potential drawn out from the storage capacitor 124 to the bit-line 118.

Figure 3:
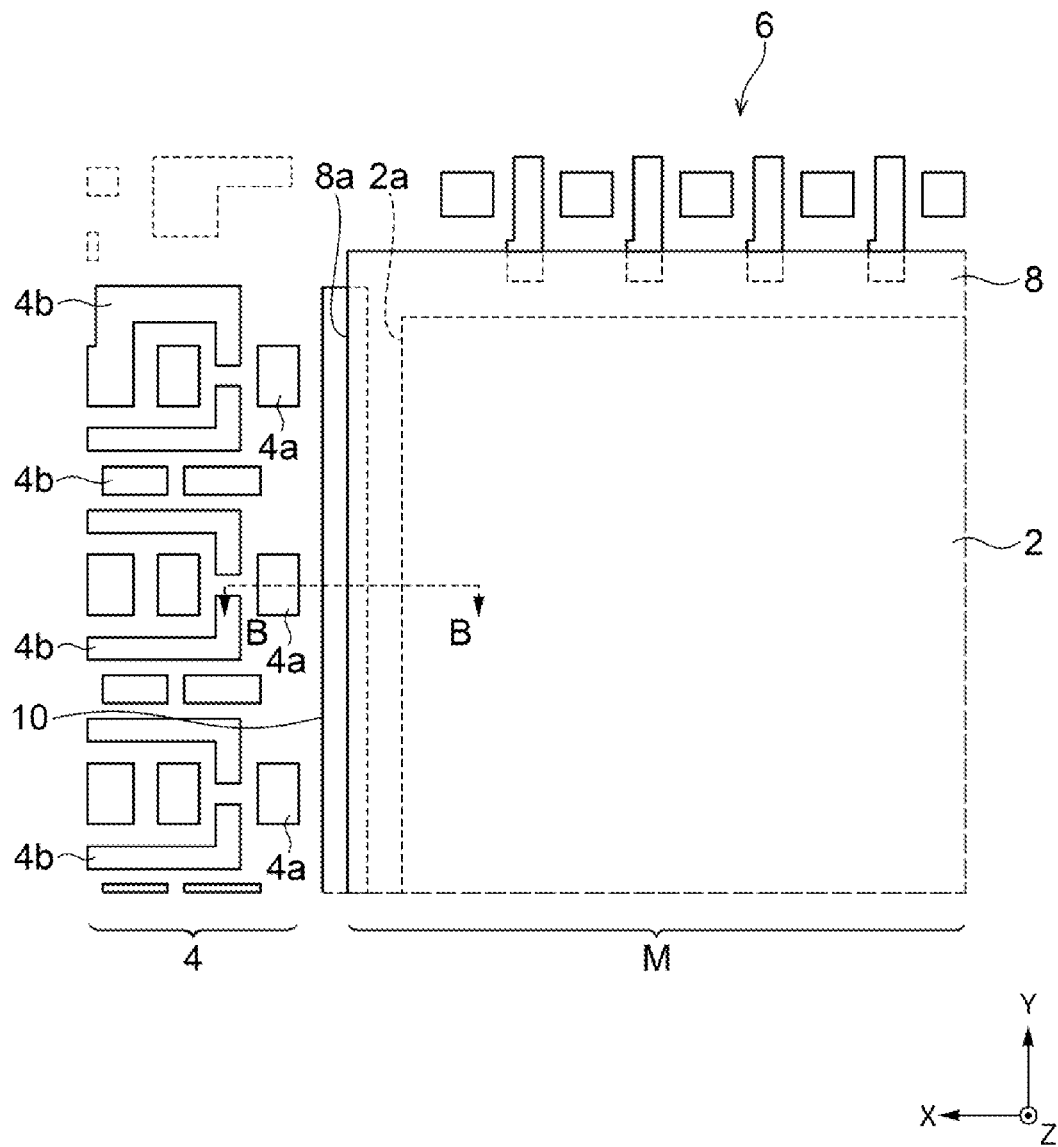
FIG. 3 is a plan view illustrating a schematic configuration of a memory mat and peripheral circuits according to a first embodiment.

FIG. 3 is a plan view illustrating a schematic configuration of the memory mat 2 and the first peripheral circuit 4 according to a first embodiment. FIG. 3 illustrates the region A in FIG. 2. As illustrated in FIG. 3, the memory mat 2 is disposed in a memory cell region M, and a plurality of memory cells 115 are arranged in the memory mat 2. A plurality of wirings 4a and 4b are arranged in the first peripheral circuit 4. The wirings 4a are disposed close to the memory mat 2.

As illustrated in FIG. 3, a dummy pattern 10 is disposed between the first peripheral circuit 4 and the memory mat 2. The dummy pattern 10 is disposed on the left side of the memory mat 2, and is not disposed on the right side of the memory mat 2. The dummy pattern 10 extends along a memory mat edge 2a. In FIG. 3, the dummy pattern 10 has a rectangular shape elongated in the Y direction which is a longitudinal direction. A plate edge 8a overlaps onto the dummy pattern 10. The dummy pattern 10 is not connected to any wirings and is electrically floating. The second peripheral circuit 6 is disposed in the Y direction of the memory mat 2. A dummy pattern is not disposed on the second peripheral circuit 6 side.

Figure 4:
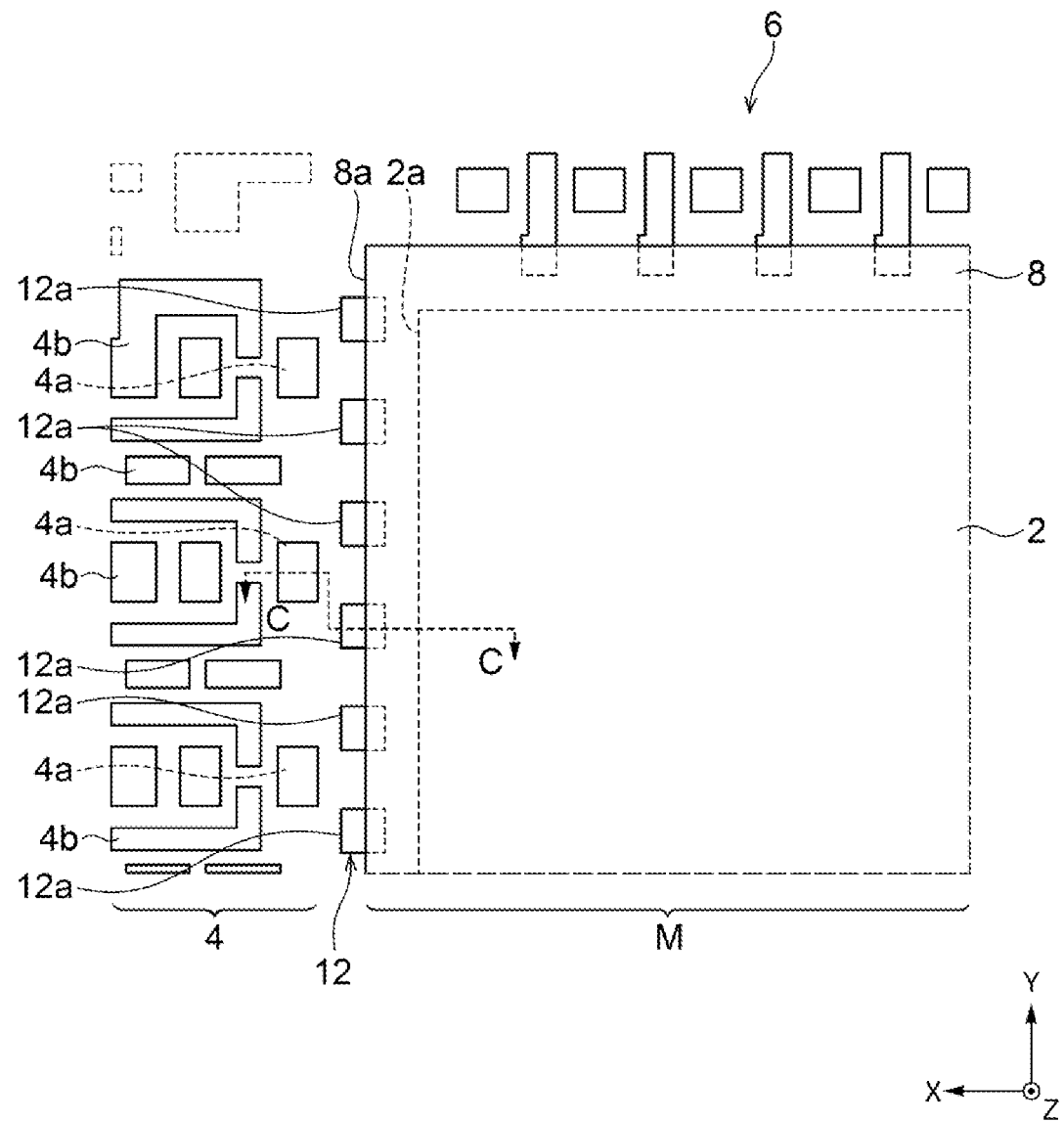
FIG. 4 is a plan view illustrating a schematic configuration of a memory mat and peripheral circuits according to a second embodiment.

FIG. 4 is a plan view illustrating a schematic configuration of the memory mat 2 and the first peripheral circuit 4 according to a second embodiment. FIG. 4 illustrates the region A in FIG. 2. As illustrated in FIG. 4, the first peripheral circuit 4 is provided with wirings 4a and 4b. The wirings 4a are disposed close to the memory mat 2. A dummy pattern 12 is disposed between the first peripheral circuit 4 and the memory mat 2. The dummy pattern 12 is disposed on the left side of the memory mat 2, and is not disposed on the right side of the memory mat 2. The dummy pattern 12 is provided with a group of independent island patterns 12a. Each of the island patterns 12a has a square shape. The group of island patterns 12a is arranged in a column along the memory mat edge 2a. In FIG. 4, the multiple island patterns 12a are arranged in a column in the Y direction, with a prescribed spacing between the island patterns 12a. A dummy pattern 12 is disposed between the first peripheral circuit 4 and the memory mat 2. The plate edge 8a overlaps onto the dummy pattern 12 arranged in a column. Each of the island patterns 12a in the dummy pattern 12 is not connected to anything and is electrically floating. The second peripheral circuit 6 is disposed in the Y direction of the memory mat 2. A dummy pattern is not disposed on the second peripheral circuit 6 side.

Figure 5:
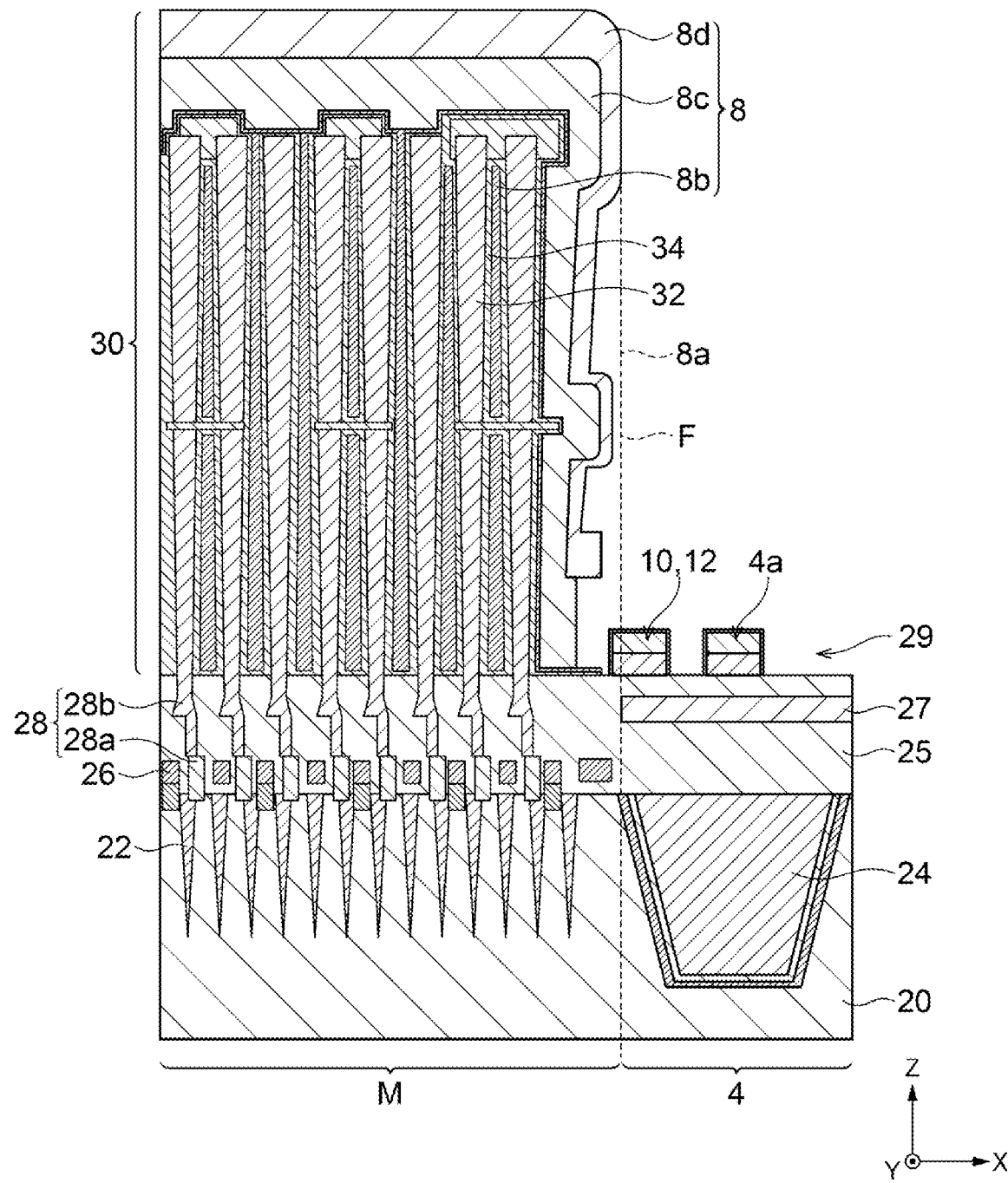
FIG. 5 is a diagram illustrating a schematic configuration of a semiconductor device according to the first and second embodiments.

FIG. 5 is a diagram illustrating a schematic configuration of a semiconductor device 1 according to the first and second embodiments. FIG. 5 is a longitudinal section of the portion along the line B-B in FIG. 3 and the line C-C in FIG. 4. As illustrated in FIG. 5, the semiconductor device 1 according to the first and second embodiments has the same cross-sectional structure along the line B-B in FIG. 3 and the line C-C in FIG. 4.

As illustrated in FIG. 5, the semiconductor device 1 is provided with a semiconductor substrate 20, and an isolation 22 and a peripheral isolation 24 which are provided on the semiconductor substrate 20. Access transistors 26, capacitor contacts 28 connected to the source/drain of the access transistors 26, and storage capacitors 30 connected to the capacitor contacts 28 are provided on the semiconductor substrate 20.

The semiconductor substrate 20 is provided with a single-crystal silicon substrate, for example. The isolation 22 and the peripheral isolation 24 are formed by embedding an insulating material into trenches formed in the semiconductor substrate 20. The insulating material has a multilayer structure of silicon dioxide ($SiO_2$) and silicon nitride (SiN), for example.

In the memory cell region M, a plurality of access transistors 26 are provided on the semiconductor substrate 20. Each access transistor 26 is a metal-oxide-semiconductor field-effect transistor (MOSFET) provided with a gate electrode, a source, and a drain, for example. The gate electrode of the access transistor 26 contains a conductive material, for example, and has a multilayer structure of polysilicon (poly-Si) doped with an impurity such as phosphorus (P), and tungsten (W), for example.

The capacitor contact 28 is provided with a first capacitor contact 28a and a second capacitor contact 28b. The first capacitor contact 28a is disposed on top of one of either the source or the drain of the access transistor 26, and the second capacitor contact 28b is disposed on top of the first capacitor contact 28a. The source/drain of the access transistor 26 and the capacitor contact 28 are electrically connected. The first capacitor contact 28a contains a conductive material such as polysilicon (poly-Si) containing an impurity such as phosphorus (P), for example. The second capacitor contact 28b contains a conductive material such as titanium nitride (TiN), for example. The access transistors 26 and the capacitor contacts 28 are covered by an interlayer insulating film 25. In the second peripheral circuit 6, a lower wiring layer 27 is disposed within the interlayer insulating film 25.

In the memory cell region M, a plurality of storage capacitors 30 are provided on the interlayer insulating film 25. The storage capacitors 30 are provided with a bottom electrode 32, a capacitive insulating film 34, and a plate electrode 8. The plate electrode 8 covers the upper of the bottom electrode 32 and the capacitive insulating film 34. The plate electrode 8 covers the upper of each of the memory mats 2. The bottom electrode 32 contains a conductive material such as titanium nitride (TiN), for example. The capacitive insulating film 34 contains an insulating material, and for example, contains a high-k insulating material such as zirconium oxide ($ZrO_2$) or hafnium oxide ($HfO_2$). The plate electrode 8 is provided with a first conductive part 8b, a second conductive part 8c, and a third conductive part 8d. The first conductive part 8b is disposed between the second capacitor contacts 28b. The second conductive part 8c and the third conductive part 8d are disposed to cover the upper and side surfaces of the bottom electrode 32 and the capacitive insulating film 34. The second conductive part 8c and the third conductive part 8d have a multilayer structure. The first conductive part 8b contains a conductive material such as titanium nitride (TiN), for example. The second conductive part 8c contains a conductive material such as polysilicon (poly-Si) doped with an impurity such as phosphorus (P), for example. The third conductive part 8d contains a conductive material such as tungsten (W), for example.

In the first peripheral circuit 4, the wirings 4a and the dummy pattern 10 or 12 are disposed on top of the interlayer insulating film 25. The dummy pattern 10 or 12 is disposed between the wiring 4a and the storage capacitor 30 of the memory cell region M. The wiring 4a and the dummy pattern 10 or 12 are provided with the same upper wiring layer 29 and have the same multilayer structure. The dummy pattern 10 or 12 is provided with the upper wiring layer 29 different from the plate electrode 8 or the lower wiring layer 27. The wiring 4a and the dummy pattern 10 or 12 have a multilayer structure of an insulating material such as silicon dioxide ($SiO_2$), for example, and a conductive material such as a tungsten (W), for example, and furthermore, the upper and side surfaces of the multilayer structure are covered by an insulating material such as silicon dioxide ($SiO_2$), for example.

The boundary line F in FIG. 5 indicates the position of the plate edge 8a and thus the boundary between the memory cell region M and the first peripheral circuit 4. The boundary line F also exists on the plate edge 8a on the opposite side.

As illustrated in FIG. 5, the plate edge 8a, or in other words the boundary between the memory cell region M and the first peripheral circuit 4, is positioned on top of the dummy pattern 10 or 12.

Figure 6:
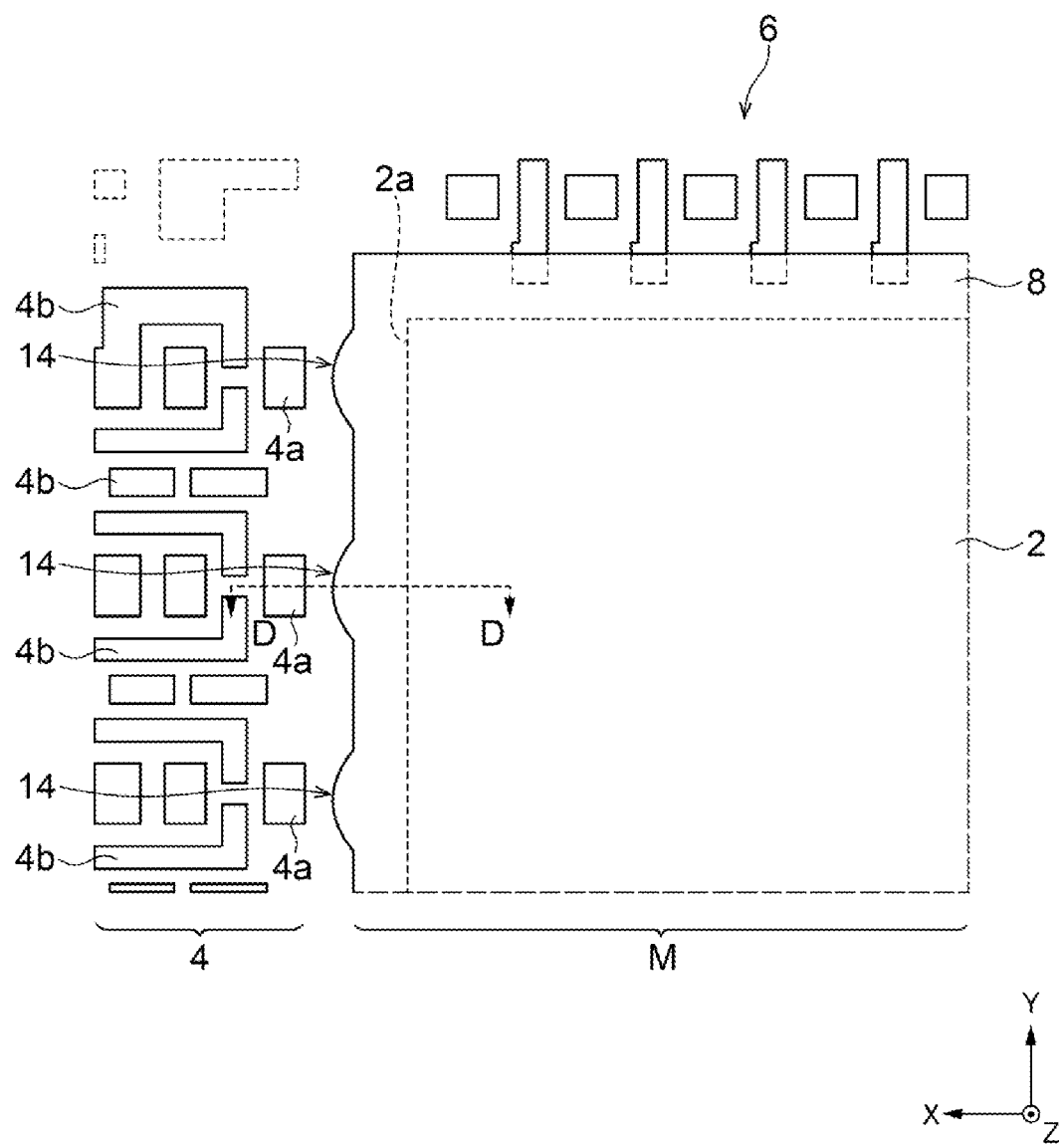
FIGS. 6 and 7 are diagrams illustrating effects of the semiconductor device according to the first and second embodiments.
Figure 7:
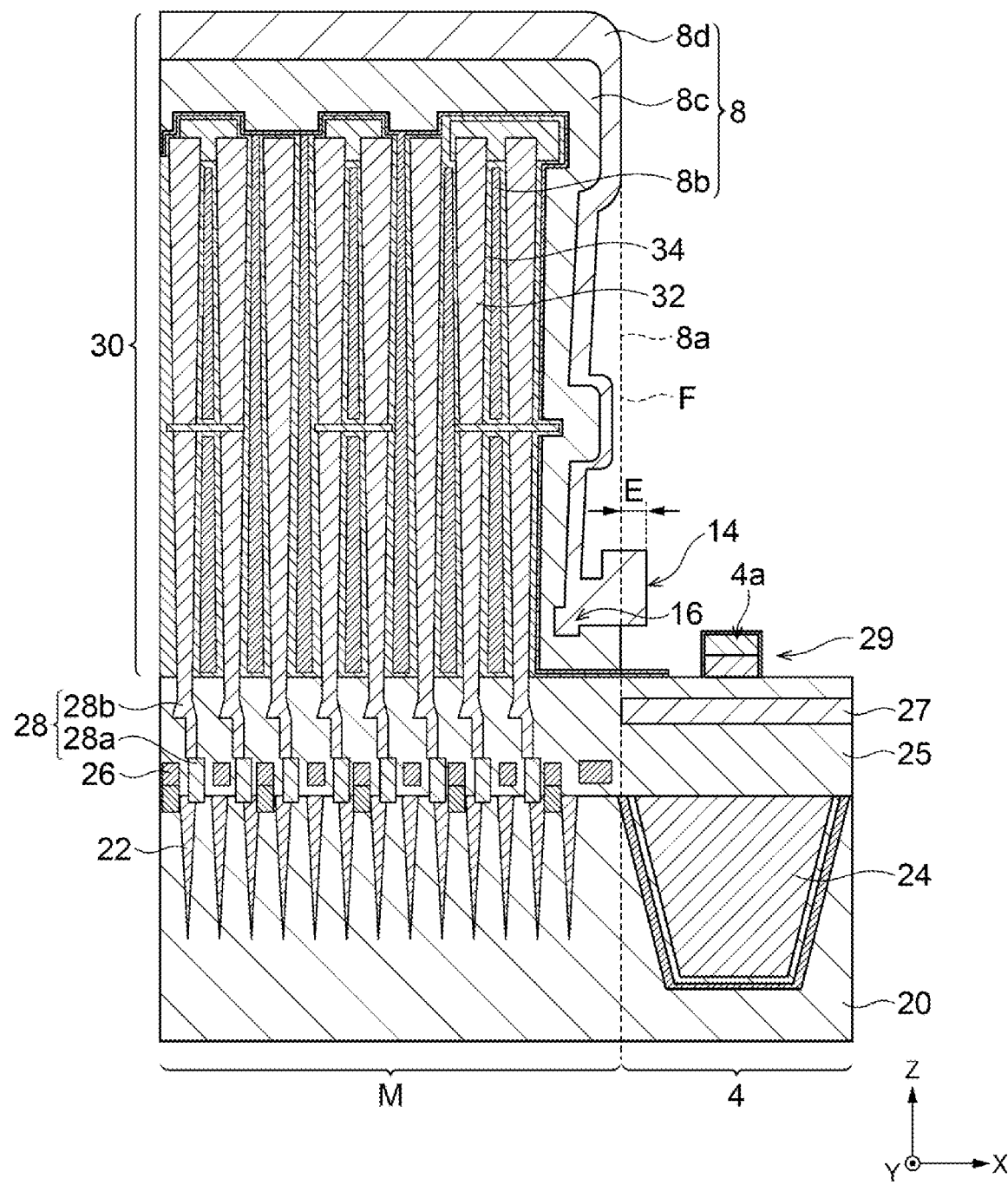

FIGS. 6 and 7 are diagrams illustrating the effects of the first and second embodiments. FIGS. 6 and 7 illustrate a schematic configuration of the semiconductor device 1 in the case where the dummy pattern 10 or 12 is not provided between the wirings 4a and the memory cell region M. As illustrated in FIGS. 6 and 7, in the case where the dummy pattern 10 or 12 is not provided, a projecting part 14 that projects toward the wirings 4a is formed in the plate electrode 8 facing the wirings 4a. Also, as illustrated in FIG. 7, a divot 16 is formed in the first conductive part 8b of the plate electrode 8, and the second conductive part 8c gets into the divot 16 and forms a projection. If the projecting part 14 exists and a contact electrode is formed on top of the wiring 4a, the distance between the contact electrode and the plate electrode 8 is reduced. Consequently, in some cases, a short may occur between the contact electrode and the plate electrode 8.

On the other hand, in the case where the dummy pattern 10 or 12 is disposed between the wirings 4a and the memory cell region M as illustrated in the first or second embodiment, the space formed between the first peripheral circuit 4 and the dummy pattern 10 or 12 and the bottom electrode 32 is filled favorably and flatly by the second conductive part 8c formed to cover the dummy pattern 10 or 12. Consequently, the projecting part 14 and the divot 16 are not formed. In other words, in the case where the dummy pattern 10 or 12 is disposed between the wirings 4a and the memory cell region M as in the first or second embodiment, the projecting part 14 is not formed. Consequently, the first and second embodiments exhibit the advantageous effect of inhibiting a short between the contact electrodes connected on top of the wirings 4a and the plate electrode 8.

As above, DRAM is described as an example of the semiconductor device according to the embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC) for example are also applicable as the semiconductor device according to the foregoing embodiments.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a first memory mat;
a second memory mat adjacent to the first memory mat;
a peripheral circuit between the first memory mat and the second memory mat, the peripheral circuit defining a first boundary to the first memory mat and a second boundary to the second memory mat and including a plurality of wiring patterns in a wiring layer;
at least one dummy pattern in the wiring layer arranged on or along the first boundary; and
a first plate electrode covering the first memory mat, wherein an edge of the first plate electrode overlaps onto the at least one dummy pattern.

2. The apparatus of claim 1, wherein the at least one dummy pattern comprises at least one wiring-shaped pattern elongated in parallel with the first boundary.

3. The apparatus of claim 1, wherein the at least one dummy pattern comprises a plurality of dummy island patterns arranged in parallel with the first boundary.

4. The apparatus of claim 1, wherein the peripheral circuit includes a sub-word driver connected to memory cells arranged in the first memory mat.

5. The apparatus of claim 1, wherein the at least one dummy pattern is electrically floating.

6. The apparatus of claim 1, wherein each of the first memory mat and the second memory mat comprises a plurality of memory cells of dynamic random-access memory.

7. The apparatus of claim 1, further comprising a second plate electrode covering the second memory mat, the second plate electrode having an edge.

8. The apparatus of claim 7, wherein the first boundary is along the edge of the first plate electrode overlapping the at least one dummy pattern.

9. An apparatus comprising:
a plurality of memory mats arranged in a matrix;
a plurality of first peripheral circuits each placed between corresponding two of the plurality of memory mats arranged adjacently in a first direction;
a plurality of second peripheral circuits each placed between corresponding two of the plurality of memory mats arranged adjacently in a second direction perpendicular to the first direction; and
a first plate electrode covering the first memory mat of the plurality of memory mats,
wherein each of a plurality of dummy patterns is placed on a corresponding one of boundaries between a corresponding one of the plurality of memory mats and a corresponding one of the plurality of first peripheral circuits, and
wherein the first plate electrode has an edge overlapping onto a selected dummy pattern of the plurality of dummy patterns.

10. The apparatus of claim 9, wherein each of the plurality of dummy patterns comprises at least one wiring-shaped pattern elongated in parallel with the corresponding boundary.

11. The apparatus of claim 9, wherein each of the plurality of dummy patterns comprises a plurality of dummy island patterns arranged in parallel with the corresponding boundary.

12. The apparatus of claim 9, wherein each of the plurality of first peripheral circuits and the plurality of second peripheral circuits includes a sub-word driver of dynamic random-access memory.

13. The apparatus of claim 9, wherein at least one of the plurality of dummy patterns is electrically floating.

14. The apparatus of claim 9, wherein each of the plurality of memory mats comprises a plurality of memory cells of dynamic random-access memory.

15. The apparatus of claim 9, further comprising a second plate electrode covering a second memory mat of the plurality of memory mats.

16. The apparatus of claim 9, wherein the corresponding one of boundaries overlaps a selected dummy pattern of the plurality of dummy patterns.

17. The apparatus of claim 9, wherein no dummy pattern is arranged on the corresponding one of boundaries corresponding to each of the plurality of second peripheral circuits.

18. An apparatus comprising:
 a first memory mat, the first memory mat comprising a first plurality of dynamic random-access memory (DRAM) elements;
 a second memory mat adjacent to the first memory mat, the second memory mat comprising a second plurality of DRAM elements;
 a peripheral circuit between the first memory mat and the second memory mat, the peripheral circuit defining a first boundary to the first memory mat and a second boundary to the second memory mat and including a plurality of wiring patterns in a wiring layer;
 at least one dummy pattern in the wiring layer arranged on or along the first boundary, the at least one dummy pattern being electrically floating;
 a wiring pattern of the plurality of wiring patterns included in the peripheral circuit and provided to face the at least one dummy pattern.

19. The apparatus of claim 18, wherein the at least one dummy pattern comprises at least one wiring-shaped pattern elongated in parallel with the first boundary.

20. The apparatus of claim 18, wherein the at least one dummy pattern comprises a plurality of dummy island patterns arranged in parallel with the first boundary.

* * * * *